United States Patent
Edwards et al.

(10) Patent No.: US 7,611,754 B2
(45) Date of Patent: Nov. 3, 2009

(54) INDUSTRIAL MICRODEPOSITION SYSTEM INCLUDING MASKING TO REDUCE THE IMPACT OF DROPLET ALIGNMENT AND DROPLET VOLUME TOLERANCES AND ERRORS

(75) Inventors: Charles O. Edwards, Pleasanton, CA (US); David Albertalli, San Jose, CA (US)

(73) Assignee: ULVAC, Inc. (JP)

( * ) Notice: Subject to any disclaimer, the term of this patent is extended or adjusted under 35 U.S.C. 154(b) by 649 days.

(21) Appl. No.: 10/535,997

(22) PCT Filed: Nov. 27, 2002

(86) PCT No.: PCT/US02/38256

§ 371 (c)(1),
(2), (4) Date: Jan. 17, 2006

(87) PCT Pub. No.: WO2004/050260

PCT Pub. Date: Jun. 17, 2004

(65) Prior Publication Data

US 2006/0165900 A1    Jul. 27, 2006

(51) Int. Cl.
*B05D 1/32* (2006.01)
(52) U.S. Cl. .................. 427/466; 427/468; 427/479; 427/504; 118/669; 118/679; 118/680
(58) Field of Classification Search .............. 427/466, 427/468, 479, 504; 118/669, 679, 680
See application file for complete search history.

(56) References Cited

U.S. PATENT DOCUMENTS

| 6,019,454 A   | * | 2/2000  | Serra et al. ................ 347/41 |
| 6,228,228 B1  |   | 5/2001  | Singh et al. |
| 6,283,572 B1  |   | 9/2001  | Kumar et al. |
| 6,754,551 B1  | * | 6/2004  | Zohar et al. ................ 700/121 |
| 2004/0223014 A1 | * | 11/2004 | Barr et al. ................ 347/12 |

FOREIGN PATENT DOCUMENTS

| EP | 0863478 A2  | 3/1998 |
| EP | 0863004 A2  | 9/1998 |
| EP | 0880303 A1  | 11/1998 |
| JP | 2002225259  | 8/2002 |
| JP | 2002-323615 | 11/2002 |

OTHER PUBLICATIONS

EPO Search Report dated Mar. 31, 2009.

* cited by examiner

*Primary Examiner*—Binh X Tran
(74) *Attorney, Agent, or Firm*—Harness, Dickey & Pierce, PLC

(57) ABSTRACT

A microdeposition system microdeposit droplets of fluid material to define a feature pattern on a substrate. The feature pattern for the substrate is defined. A mask is created for the feature pattern that reduces a density of defects that occur due to a malfunctioning nozzle of the microdeposition head. The droplets of fluid material are microdeposited onto the substrate based on the mask to define subfeatures of the feature pattern. One of the nozzles of the microdeposition head is assigned to each of the sub-features in the feature pattern. The nozzles may be assigned randomly or using other functions. The assigned nozzles in the mask are assigned to one of a plurality of passes of the microdeposition head.

16 Claims, 17 Drawing Sheets

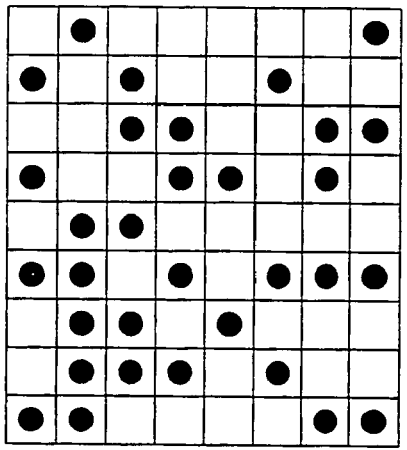
FIG. 7
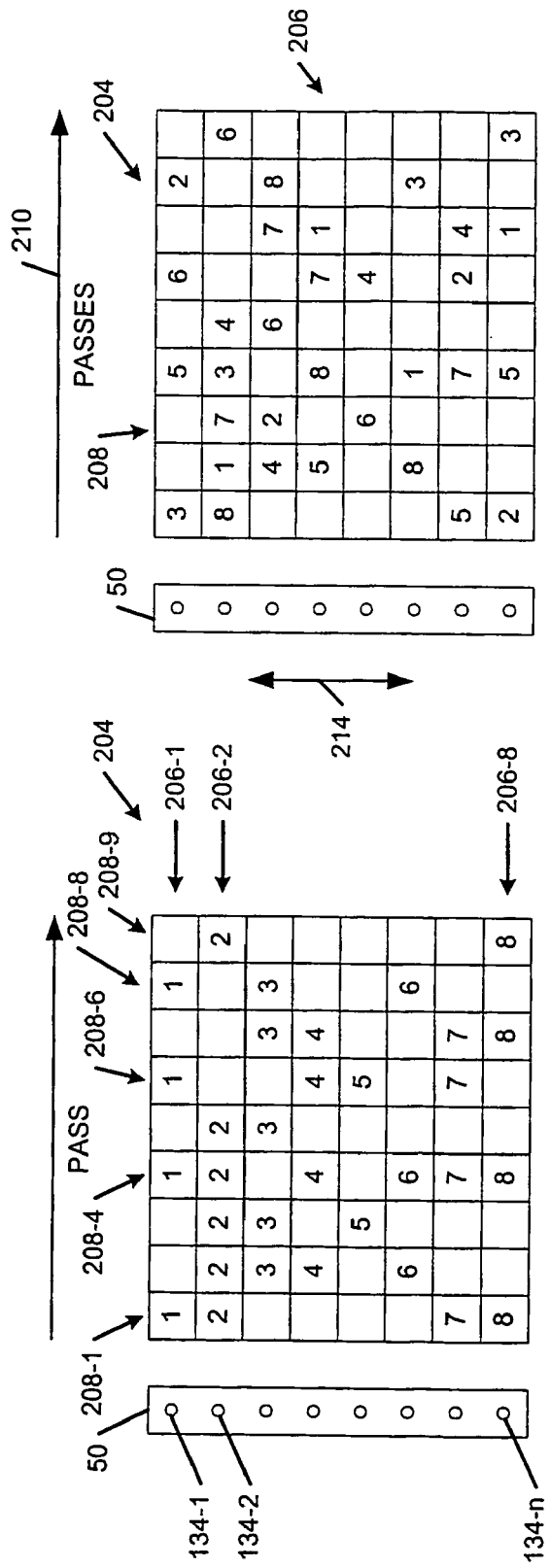
FIG. 9
FIG. 8

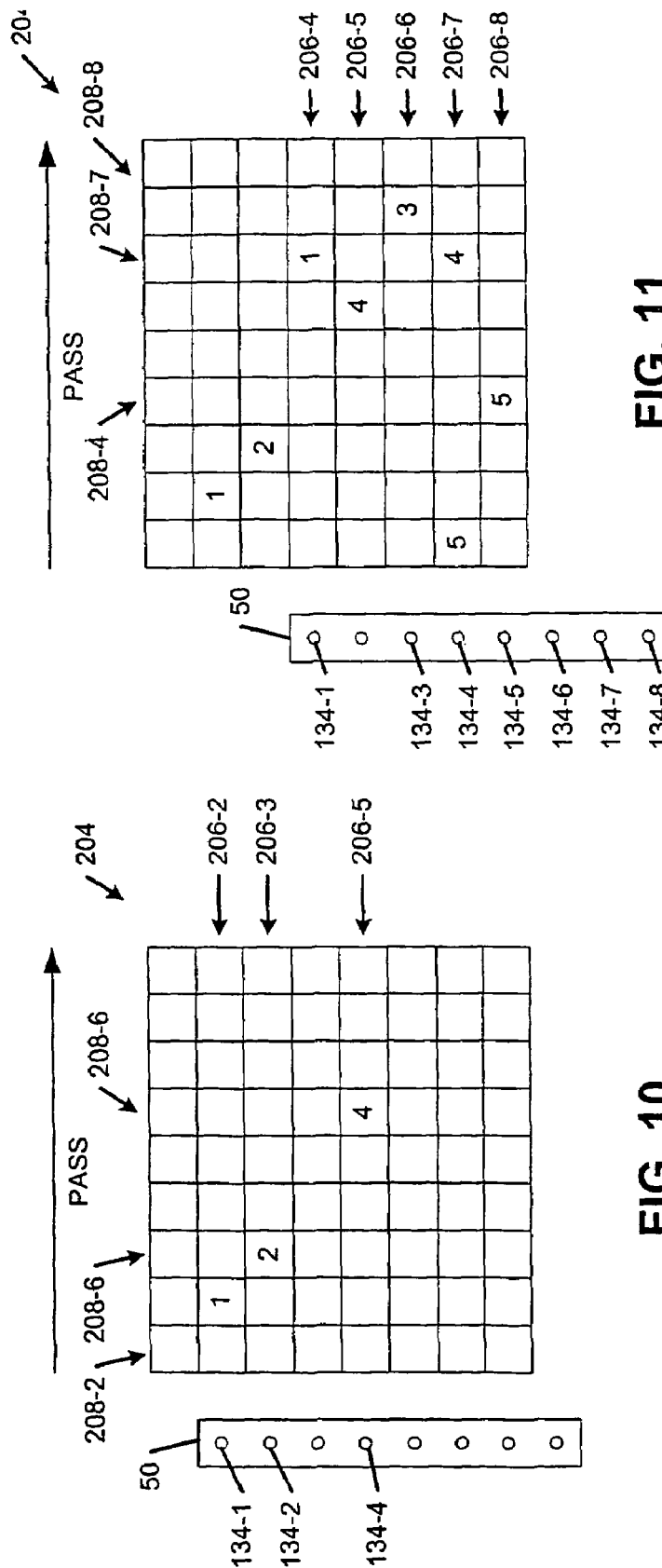

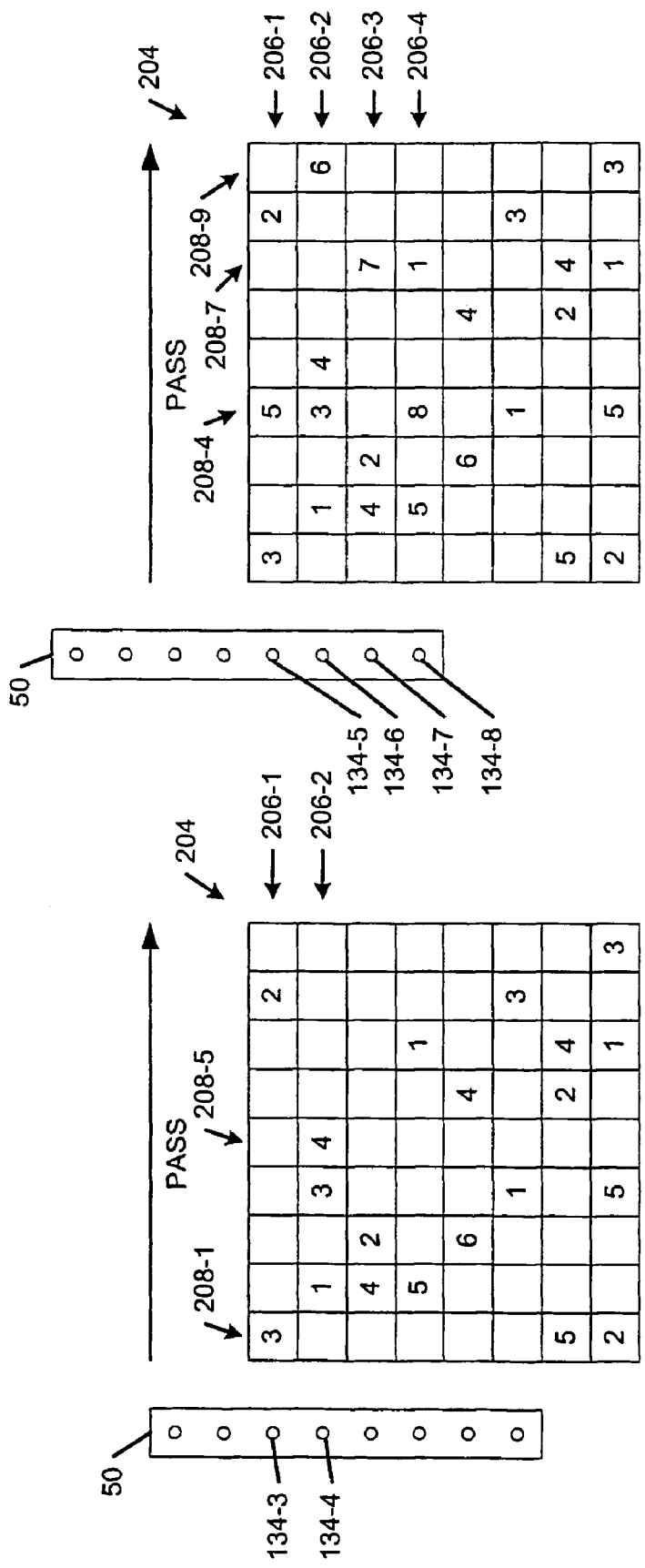

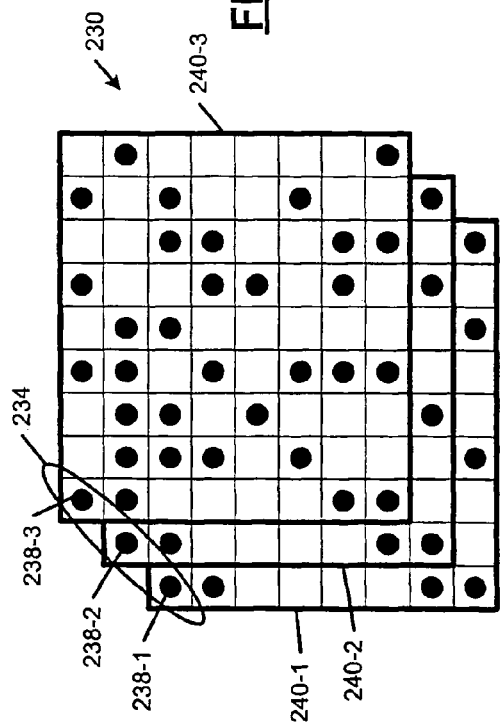
FIG. 23
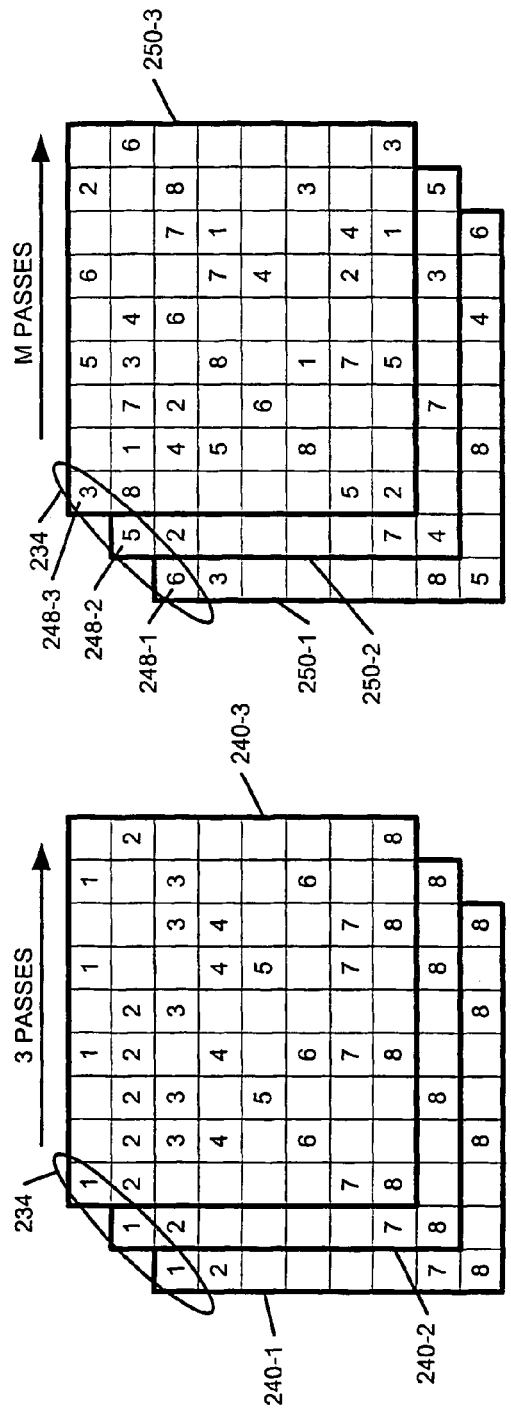
FIG. 24
FIG. 25

INDUSTRIAL MICRODEPOSITION SYSTEM INCLUDING MASKING TO REDUCE THE IMPACT OF DROPLET ALIGNMENT AND DROPLET VOLUME TOLERANCES AND ERRORS

FIELD OF THE INVENTION

The present invention relates to microdeposition systems, and more particularly to a mask generator for microdeposition systems used to fabricate printed circuit boards, polymer light emitting diode (PLED) displays, and other electronic devices requiring microdeposition of fluid materials.

BACKGROUND OF THE INVENTION

Manufacturers have developed various techniques for fabricating microstructures that have small feature sizes on substrates. Typically the microstructures form one of more layers of an electronic circuit. Examples of these structures include polymer light-emitting diode (PLED) display devices, liquid crystal display (LCD) devices, printed circuit boards and the like. Most of these manufacturing techniques are relatively expensive to implement and require high production quantities to amortize the cost of the fabrication equipment.

Techniques for forming microstructures on a substrate include screen printing. During screen printing, a fine mesh screen is positioned on the substrate. Fluid material is microdeposited through the screen and onto the substrate in a pattern defined by the screen. Screen printing requires contact between the screen and the substrate. Contact also occurs between the screen and the fluid material, which contaminates both the substrate and the fluid material.

Photolithography is another manufacturing technique that is used to manufacture microstructures on substrates. Photolithography is also not compatible with the fabrication of some devices. Manufacturing processes using photolithography generally involve the deposition of a photoresist material onto a substrate. The photoresist material is cured by exposure to light. A patterned mask is used to selectively apply light to the photo resist material. Photoresist that is exposed to the light is cured and unexposed portions are not cured. The uncured portions are removed from the substrate. An underlying surface of the substrate is exposed through the removed photoresist layer. The cured portions of the photo resist layer remain on the substrate. Another material is then microdeposited onto the substrate through the opened pattern on the photoresist layer, followed by the removal of the cured portion of the photoresist layer.

Photolithography has been used successfully to manufacture many microstructures such as traces on circuit boards. However, photolithography contaminates the substrate and the material formed on the substrate. The cost of the photolithography process can be prohibitive when relatively small quantities are to be fabricated.

Spin coating has also been used to form microstructures. Spin coating involves rotating a substrate while depositing fluid material at the center of the substrate. The rotational motion of the substrate causes the fluid material to spread uniformly across the surface of the substrate. Spin coating is also an expensive process because a majority of the fluid material does not remain on the substrate. Additional material is wasted due to the requirement that the entire surface of the substrate must be coated with a uniform layer. While laser ablation can be used to remove material, laser ablation requires expensive equipment. Laser ablation may also create ash, which contaminates the substrate. In addition, the size of the substrate is limited by the spin coating process to less than approximately 12", which makes spin coating unsuitable for larger devices such as PLED televisions.

SUMMARY OF THE INVENTION

A microdeposition system and method according to the present invention microdeposits droplets of fluid material to form a feature pattern on a substrate. The feature pattern for the substrate is initially defined. A mask is created for the feature pattern that reduces a density of defects that occur due to tolerance variations and/or a malfunctioning nozzle of the microdeposition head. The droplets of fluid material are microdeposited onto the substrate based on the mask to define sub-features of the feature pattern.

In other features, one of the nozzles of the microdeposition head is assigned to each of the sub-features in the feature pattern. The step of assigning nozzles may include randomizing an assigned nozzle for the sub-features. The assigned nozzles in the mask are also assigned to one of a plurality of passes of the microdeposition head.

In still other features, the microdeposition pass is performed by at least one of moving the microdeposition head in a linear direction relative to the substrate and moving the substrate in a linear direction relative to the microdeposition head.

In other features, at least one of the sub-features is formed by multiple droplets that are microdeposited in layers. The mask assigns a different nozzle to each of the layers of the multiple-layer sub-feature.

In yet other features, the feature pattern may define a component of an electrical device. The electrical device may be one of a polymer light emitting diode, a light panel, an integrated circuit package and a printed circuit board. The droplets may form at least one of a light emitter, an electrical conductor, an electrical trace, an insulator, solder bumps, bondwire, plating, interconnects, a capacitor and a resistor.

In yet other features, the mask increases a number of microdeposition passes required to microdeposit the feature pattern and reduces repeated firing of nozzles of the microdeposition head during each of the microdeposition passes.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 7 illustrates a portion of the feature pattern in FIG. 6;

FIG. 8 illustrates microdeposition of sub-features of the portion on the substrate in a single pass using microdeposition without masking;

FIG. 9 illustrates microdeposition of sub-features on the substrate with an exemplary mask to reduce the impact of defects due to nozzle misalignment and/or improper drop formation of one or more nozzles;

FIGS. 10-22 illustrate successive passes for depositing additional sub-features of the exemplary mask in FIG. 9;

FIG. 23 illustrates a feature pattern including sub-features defined by multiple droplet layers;

FIG. 24 illustrates deposition of a multiple layer sub-feature in the feature pattern of FIG. 23 using the same nozzle to microdeposit all of the layers;

FIG. 25 illustrates deposition of the multiple layer sub-feature in the feature pattern of FIG. 23 by varying nozzles used to microdeposit the different layers;

DETAILED DESCRIPTION OF THE PREFERRED EMBODIMENTS

Figure 1:
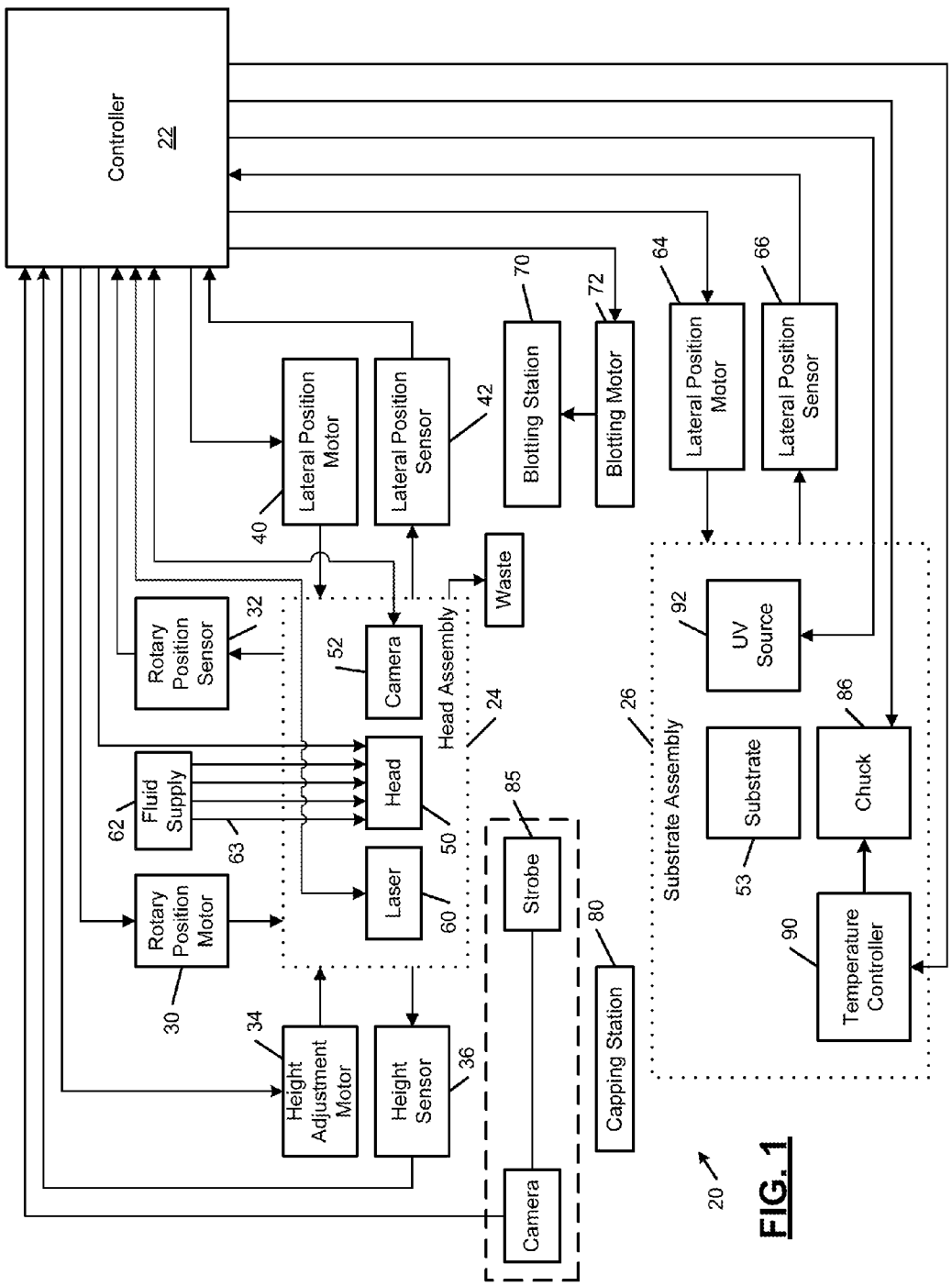
FIG. 1 is a functional block diagram of an exemplary microdeposition system according to the present invention.

The following description of the preferred embodiment(s) is merely exemplary in nature and is in no way intended to limit the invention, its application, or uses. For purposes of clarity, the same reference numbers will be used in the drawings to identify similar elements.

Microdeposition of fluid materials onto a substrate is disclosed in detail in commonly assigned applications entitled "Interchangeable Microdeposition Head Apparatus and Method", Ser. No. 10/479,322, filed Nov. 26, 2003, now abandoned; "Waveform Generator for Microdeposition Control System", Ser. No. 10/479,323, filed Jun. 17, 2004, now U.S. Pat. No. 7,449,070; "Over-Clocking in a Microdeposition Control System to Improve Resolution", Ser. No. 10/479,316, filed Jun. 14, 2004, now U.S. Pat. No. 7,244,310; and "Industrial Microdeposition Systems for Polymer Light Emitting Diode Displays, Printed Circuit Boards and the Like", Ser. No. 10/479,318, filed Aug. 18, 2004, now U.S. Pat. No. 7,270,712, which are hereby incorporated by reference.

These applications disclose the deposition of fluid materials onto a substrate using a microdeposition head including a plurality of nozzles. Various ways of aligning the nozzles and/or adjusting the shape of the resulting droplets that are fired from the microdeposition head are disclosed. While these methods improve the uniformity and alignment of droplets that are discharged onto the substrate, minor variations in droplet size and alignment may still occur.

Briefly, the present invention generates a mask that alters a relationship between nozzles of the microdeposition head that are assigned to microdeposit sub-features in the feature pattern to reduce (or de-localize) the impact of nozzles that are both functioning and malfunctioning. As used herein, the term malfunctioning refers to nozzles that are misaligned outside of a desired tolerance or specification and/or have droplet formation/volume that is outside of a desired specification. The term functioning shall refer to nozzles that are within the desired tolerance or specification and have droplet formation/volume that is within the desired specification.

For example, functioning nozzles may have a tolerance of +/−5% for alignment and/or drop volume. These tolerances can correspond to a difference of 10% between adjacent nozzles, which may cause problems for some devices formed by microdeposition. Further, the difference between a malfunctioning nozzle and a functioning nozzle can exceed 10%, which also may cause problems for some devices formed by microdeposition.

The foregoing discussion will initially describe an exemplary microdeposition system followed by a discussion of methods according to the present invention for delocalizing the impact of the droplet size and/or alignment variations that may occur for both functioning and malfunctioning nozzles.

FIGS. 1-5 illustrate an exemplary microdeposition system 20. Referring now to FIG. 1, a microdeposition system 20 is illustrated and includes a controller 22, a head assembly 24, and a substrate assembly 26. A rotational position or pitch of the head assembly 24 is adjusted using an optional rotary position motor 30 and an optional rotary position sensor 32. Manual adjustment can also be performed. Likewise, a height of the head assembly 24 relative to the substrate assembly 26 may be adjusted using a height adjustment motor 34 and a height sensor 36. A lateral position of the head assembly 24 is adjusted using a lateral position motor 40 and a lateral position sensor 42. Manual height and lateral position may be performed to reduce cost.

A microdeposition head 50 with a plurality of nozzles is mounted on the head assembly 24. A first camera 52 is optionally mounted on the head assembly 24. The first camera 52 is used to position the head assembly 24 relative to a substrate 53 that is located on the substrate assembly 26. More particularly, the first camera 52 is used to align the microdeposition head 50 using one or more nozzles of the head 50 as a reference. In addition, the first camera 52 is used to perform drop analysis on the substrate.

A laser 60 can optionally be used for laser ablation of applied fluid material to reduce minimum feature sizes and/or for creating vias. While the laser 60 is mounted on the head assembly 24 in FIG. 1, the laser 60 can be mounted on a laser assembly (not shown) that moves independently from the head assembly 24. A fluid supply 62 is connected by one or more conduits 63 to the microdeposition head 50. The fluid supply 62 provides one or more types of fluid materials, such as polymer PPV for red, green and blue pixels, solvent, resistive fluid materials, conductive fluid materials, resist fluid materials, and/or insulating fluid materials. The fluid supply 62 is optionally capable of changing the fluid material that is supplied by using a solvent flush before switching to a new fluid material.

A lateral position motor 64 and a lateral position sensor 66 are used to position the substrate assembly 26 with respect to the head assembly 24. In a preferred embodiment, the lateral position motor 40 moves along a first axis. The lateral position motor 64 moves along a second axis that is perpendicular to the first axis. As can be appreciated by skilled artisans, the position motors 30, 34, 40 and 64 are associated with either the head assembly 24 or the substrate assembly 26. In other words, the degrees of relative movement and rotation may be provided by moving or rotating the substrate assembly 26 and/or the head assembly 24 and any combination thereof.

A blotting station 70 and a blotting media motor 72 are preferably located adjacent to the substrate assembly 26. To prevent clogging of nozzles of the microdeposition head 50, the microdeposition head 50 is cleaned periodically during use. The microdeposition head 50 is moved into position over the blotting station 70 and a nozzle plate (not shown) of the microdeposition head is wiped on the blotting station 70. The blotting station 70 includes a roll of blotting material. A blotting motor 72 advances the roll of blotting material to provide a clean surface for blotting of the nozzle plate of the microdeposition head 50.

A capping station 80 is also located adjacent to the head assembly 24. The microdeposition head 50 is parked in the capping station 80 when the microdeposition system 20 is not in use. The capping station 80 includes a cup containing wet fluid material and/or solvent. The capping station 80 is used to prevent the fluid material that is delivered by the microdeposition head 50 from clogging the nozzles of the microdeposition head 50. A second camera 84 is used for droplet analysis and is located adjacent to the capping station 80. Preferably, the first and second cameras 52 and 84 and the controller 22 provide digital optical recognition. A strobe 85 may be provided to capture the droplets.

The substrate assembly 26 includes a chuck 86, which engages and positions the substrate 53. The substrate assembly 26 includes an optional curing device such as a temperature controller 90 and/or an optional ultraviolet (UV) source 92. The temperature controller 90 controls the temperature of the chuck 86. A temperature of approximately 50° C. is typically suitable to reduce drying times for substrates having thicknesses between 0.3 and 1.2 mm. The chuck 86 preferably includes a vacuum circuit that positions and engages the substrate 53. Alternately, the chuck 86 may include other types of devices that position and engage the substrate 53 during microdeposition. For example, fluid surface tension, magnetism, physical engagement of the substrate or any other approach may be used to engage the substrate 53 during microdeposition. Additional details concerning the chuck are found in "Temperature Controlled Vacuum Chuck", Ser. No. 10/479,078, filed Nov. 11, 2003, now U.S. Pat. No. 7,160,105, which is hereby incorporated by reference.

Skilled artisans will appreciate that manual adjustment devices such as a hand adjustment (for example, a knob that turns a worm gear or any other mechanical adjustment) can be used to replace one or more of the motors 30, 34, 40, and 64 to reduce cost. Visual devices such as a scale can be used to replace one or 35 more of the sensors 32, 36, 42, and 66 to reduce cost. In addition, the function of the motors 30, 34 and/or 40 may be combined in a multi-axis motor if desired. In one embodiment, one or more of the positioning devices are implemented using an air bearing and a linear motor. Still other variations will be apparent to skilled artisans. The functionality that is provided by the motors and sensors is similar to a computer numerical controlled (CNC) milling machine. Preferably, the motors provide adjustment in three or more axes. Additional ranges of motion can be provided for three-dimensional (3D) microdeposition or microdeposition of complex curved shapes.

The microdeposition head 50 is preferably positioned over the substrate at a distance of between approximately 0.5 mm and 2.0 mm. In a highly preferred embodiment, the microdeposition head is positioned a distance that is at least 5 times the size of the droplet of the fluid material, although other heights may be used. When smaller pitch sizes are required, the microdeposition head 50 is rotated to reduce the pitch. When larger pitches are required, the microdeposition head 50 is rotated and some of the nozzles are not used, for example every other nozzle is not used.

As can be appreciated, the microdeposition system 20 shown in FIG. 1 includes one or more optional systems. For example, optional systems include, but are not limited to, laser ablation, automated height and pitch positioning systems, optical imaging, chuck temperature control, and/or UV curing. For example when microdepositing the same product in a high volume production application, mechanical alignment techniques can be used. The pitch of the microdeposition head can be mechanically adjusted to a desired pitch.

Figure 2:
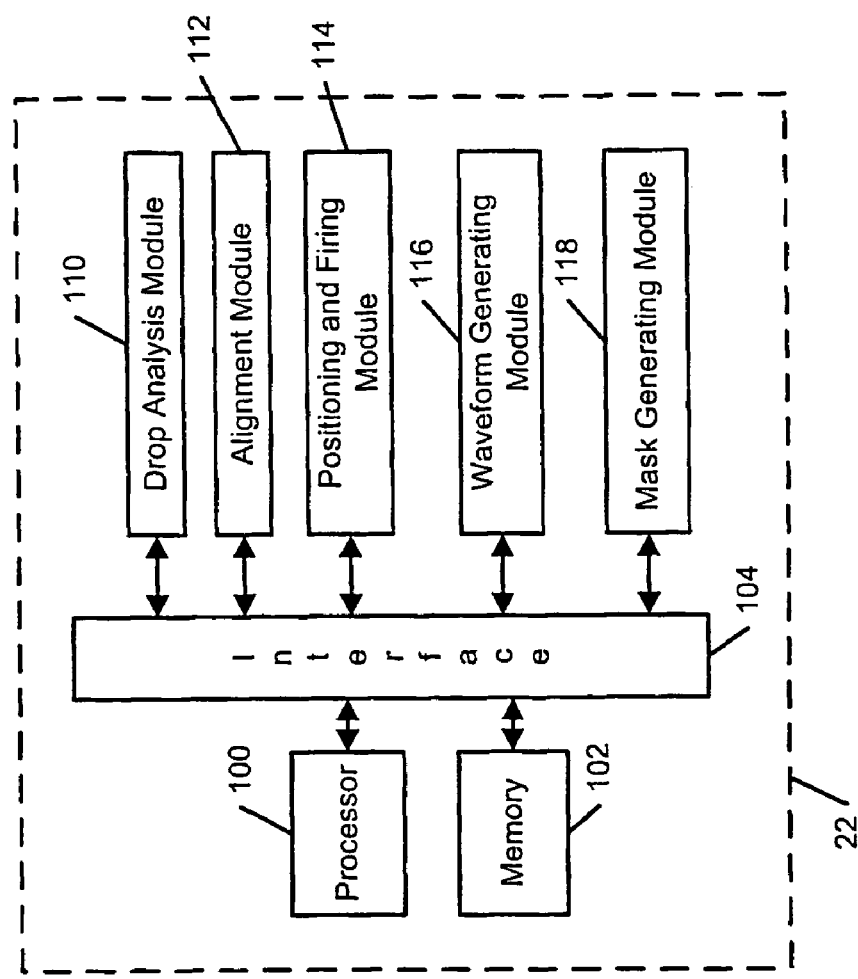
FIG. 2 is a functional block diagram of a controller including a mask generating module for the microdeposition system of FIG. 1.

Referring now to FIG. 2, the controller 22 is illustrated in further detail. The controller 22 includes one or more processors 100, memory 102 (such as random access memory (RAM), read-only memory (ROM), flash memory, and/or any other suitable electronic storage medium), and an input/output interface 104. As can be appreciated, while a single controller 22 is shown, multiple controllers may be used. A drop analysis module 110 optionally performs drop analysis using the first camera 52 and/or second camera 84, as will be described more fully below.

An optional alignment module 112 aligns the substrate and the head 50 using optical character recognition (before depositing the fluid material) using the first camera 52 and/or the second camera 84. Manual alignment can also be performed. A nozzle position and firing module 114 adjusts the position of the head assembly 24 with respect to the substrate 53 and generates nozzle firing waveforms to create features on the substrate. A waveform generating module 116 operates in conjunction with the nozzle position and firing module 114 and adjusts the timing, rise slope, fall slope, and/or amplitude of nozzle firing waveforms, as will be described more fully below. The waveform generating module 116 also optionally adjusts nozzle firing timing for changes in the pitch of the head.

A mask generating module 118 generates a mask that assigns sub-features of the feature pattern to the nozzles of the microdeposition head 50 for each pass. As used herein, the term mask refers to a digital file, relationship and/or algorithm between sub-features of the feature pattern and the nozzle that is assigned (rather than a physical mask such as those used in photolithography). The mask generating module 118 reduces the number of sub-features microdepositioned by a single nozzle during a microdeposition pass. In one exemplary embodiment, the mask generating module 118 randomizes or otherwise changes a relationship between the assigned nozzle and the sub-feature in the feature pattern.

The substrate 53 may includes a plurality of marks that are used by the first camera 52 and/or the second camera 84 to align the substrate 53 and the head 50 before depositing the fluid material(s). Rough initial or final positioning may be performed manually if desired. Alternately, the alignment module 112 may use optical character recognition to perform rough and/or fine alignment using the marks.

An exemplary microdeposition head 50 is a shear mode piezo transducer (PZT) microdeposition head. When the nozzle firing waveforms are triggered by the controller 22, shear mode actuation causes the droplet to be dispensed. Skilled artisans will appreciate that other types of microdeposition heads are contemplated such as thermal or bubble microdeposition heads, continuous drop microdeposition heads, PZT valves, and microelectromechanical valves. The head assembly 24 may also include multiple microdeposition heads 50.

Typically, the microdeposition head 50 will include between 64 and 256 nozzles, although additional or fewer nozzles may be utilized. Each nozzle of the microdeposition head 50 is capable of dispensing between 5000-20,000 drops per second, although higher or lower drop dispensing rates may be provided. Typically, each droplet contains between 10 and 80 picoliters of fluid material depending upon the type of microdeposition device that is used, although increased or decreased droplet volume may be provided.

Exemplary devices that can be fabricated using the microdeposition system 20 include monochrome and color PLEDs, printed circuit boards (PCBs), and other structures. A resist replacement such as an acrylic polymer can be microdeposited to eliminate the mask and exposure process in photolithography. A metallic ink or another metallic conducting fluid can be microdeposited to replace traces. Fluids having resistive properties such as resistive inks can be used to create resistors and capacitors. The microdeposition system may also be used to microdeposit legends, solder mask, solder paste and other fluid materials that are used in printed circuit board manufacturing. Laser trimming of the microdeposited droplets is optionally employed to improve accuracy with a corresponding increase in cost. Microdeposition can be used to fabricate a pixel plate of a light panel. The fuses and traces can be microdeposited. Microdeposition can also be used to microdeposit solder bumps, bondwire, and other structures on integrated circuit packages. Still other applications will be apparent to skilled artisans.

Curing devices may be provided with the substrate assembly 26 to control curing and shrinkage. The temperature controller 90 and/or ultraviolet (UV) source 92 are provided to facilitate proper curing of the fluid material that is microdeposited in the wells. For example, the temperature controller 90 heats the chuck 86, which warms the substrate 53 through contact. Alternately, the UV source 92 generates ultraviolet light that is directed at the fluid material that is microdeposited on the substrate 53 to facilitate curing. Additionally, airflow in a vicinity surrounding the substrate assembly may be controlled (prevented) using an enclosure, a fan, or other suitable airflow equipment. Equipment that is typically used in a clean room may be employed.

Figure 3:
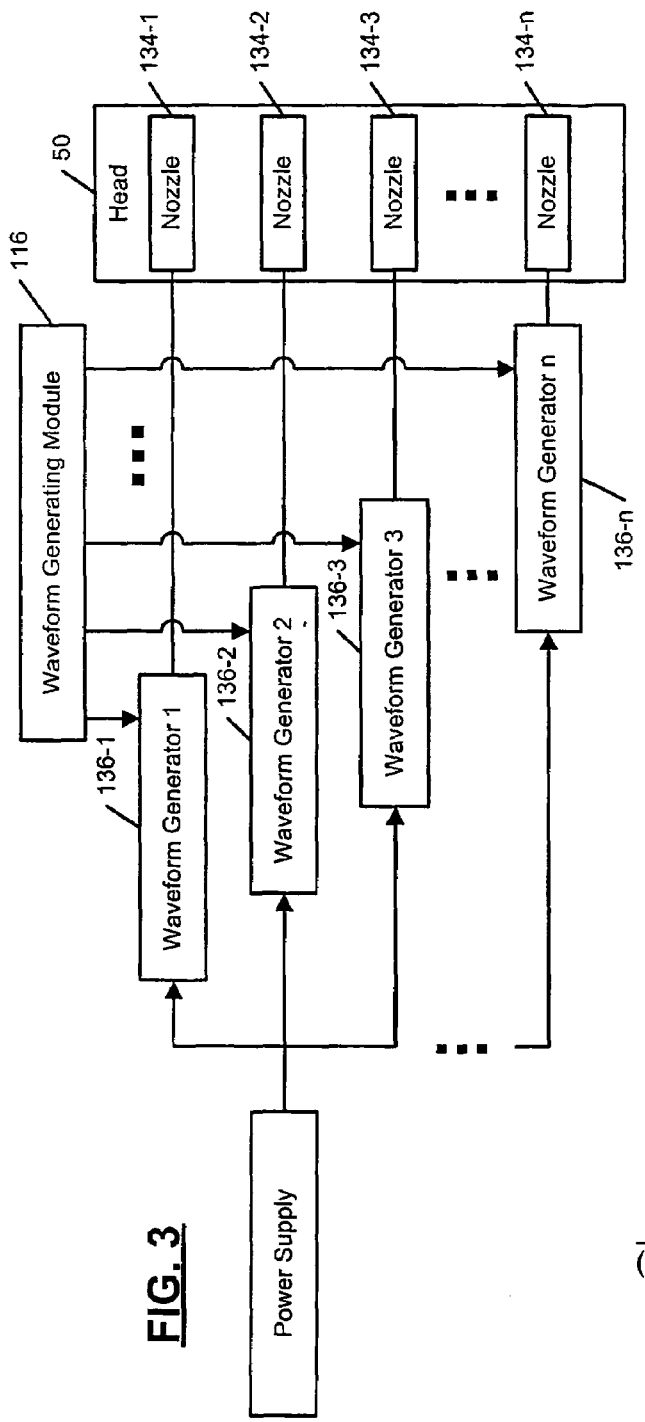
FIG. 3 illustrates a waveform generator that is capable of generating different firing waveforms for each nozzle.
Figure 4:
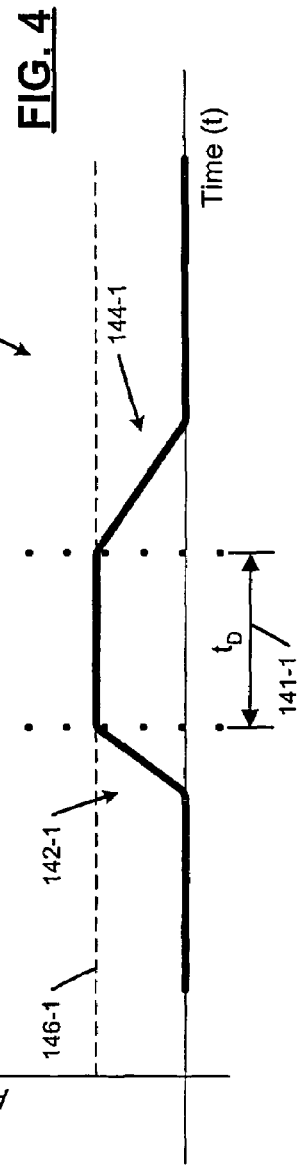
FIG. 4 illustrates rise slope, duration, timing and fall slope of an exemplary nozzle firing waveform.
Figure 5:
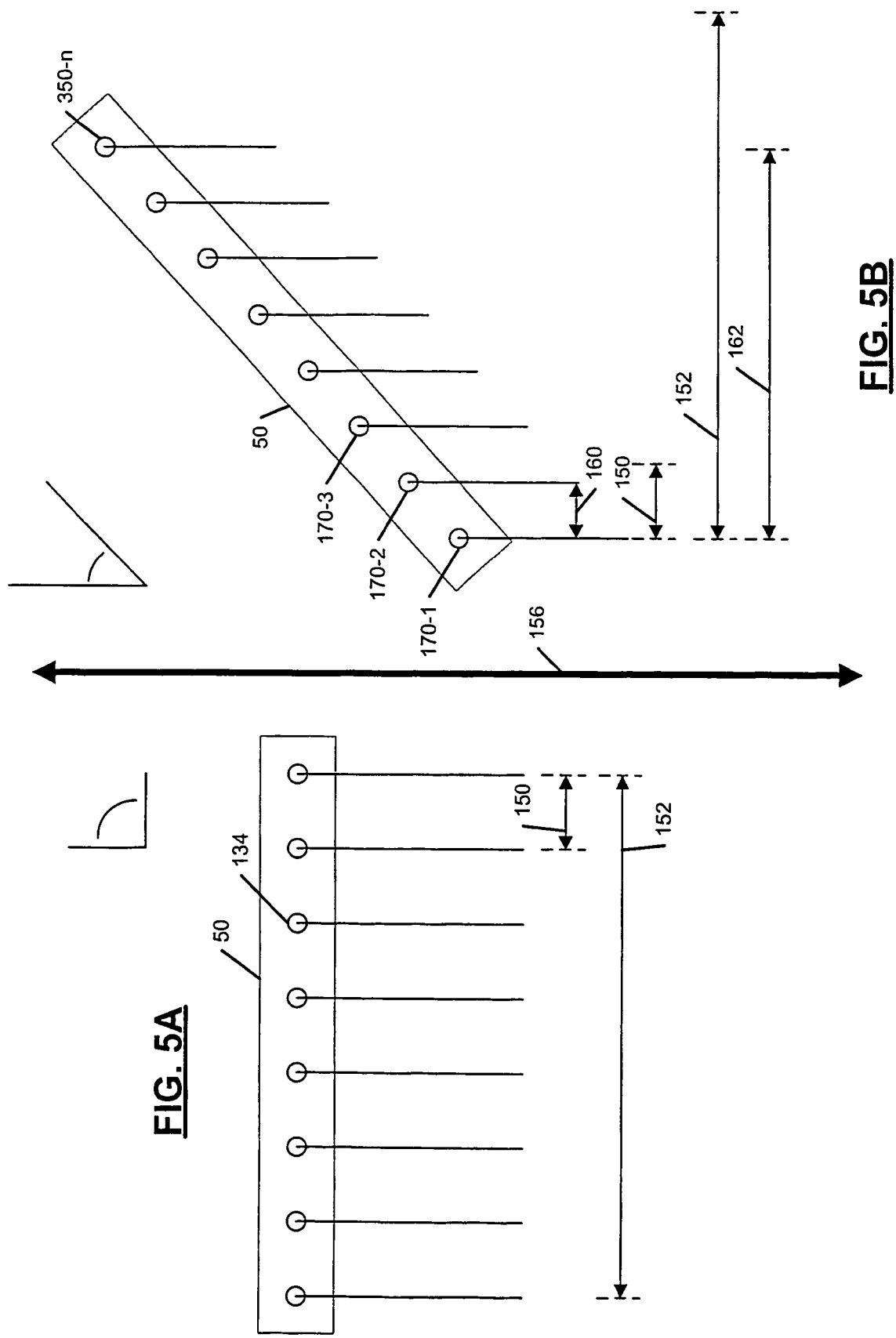
FIGS. 5A and 5B illustrates pitch adjustment of the microde position head.

Referring now to FIGS. 3 and 4, nozzle firing waveforms for each of the nozzles 134-1, 134-2, 134-3, . . ., and 134-n are individually controlled by the controller 22. By controlling the nozzle firing waveforms individually, the uniformity of droplets is significantly improved. In other words, if the droplets from a particular nozzle have a non-uniform or undesirable shape, the nozzle firing waveform for the corresponding nozzle is adjusted to provide a droplet with a uniform or desired shape. The waveform generating module 116, the drop analysis module 110 and/or the position and firing modules 114 collect data using the first and/or second cameras 52 and 84 and optical recognition. Adjustments may be made automatically using software and feedback from droplet analysis.

More particularly, the waveform generating module 116 communicates with waveform generators 136-1, 136-2, 136-3, . . ., and 136-n to individually adjust timing, duration, amplitude, rise slope and/or fall slopes of the nozzle firing waveforms for each of the nozzles 134. In FIG. 4, an exemplary nozzle firing waveform 140-1 is shown. The exemplary nozzle firing waveform 140-1 has a duration timing $t_D$ 141-1, a rise slope 142-1, a fall slope 144-1 and amplitude 146-1. Each of these parameters can be adjusted by the waveform generators 136 to vary the characteristics of the nozzle firing waveform.

Over-clocking may also be used to improve feature resolution. Over-clocking is used to provide improved resolution and to optionally adjust for changes in the pitch of the head 50. As used herein, over-clocking refers to an increased clock frequency relative to a droplet width and a lateral and vertical speed of the microdeposition head. In microdeposition applications such as ink jets, a print grid is defined that includes grid lines that occur at a clock rate. The clock rate and lateral and vertical head speed are synchronized to provide (or not provide) one droplet in each rectangle (or square) of the grid. In other words, the droplet to grid rectangle ratio is 1:1. Some minor overlapping of droplets may occur in ink jets. Either a droplet is produced or is not produced in each rectangle or square of the grid. Over-clocking involves using a clock rate that is substantially higher. The clock rate is increased at least 3 times the conventional 1:1 ratio. In a highly preferred embodiment, the clock rate is increased 10× or more.

Referring now to FIGS. 5A and 5B, the microdeposition head 50 includes a plurality of nozzles 134 that are preferably spaced uniformly. However, non-uniform spacing can also be used. The angular orientation of the microdeposition head 50 is adjusted relative to a plane defined by lateral movement of the head assembly and/or the substrate. When the microdeposition head 50 has a generally perpendicular orientation relative to the movement of the substrate 53 (shown by arrow 156), the pitch is at a maximum value as is illustrated at 150. Likewise, an area that is swept by the head 50 is also at a maximum value as indicated at 152. As the angle of the head 50 is decreased from the perpendicular orientation, the pitch decreases as indicated at 160. Likewise, the area that is swept by the head 50 also decreases as indicated at 162.

Figure 6:
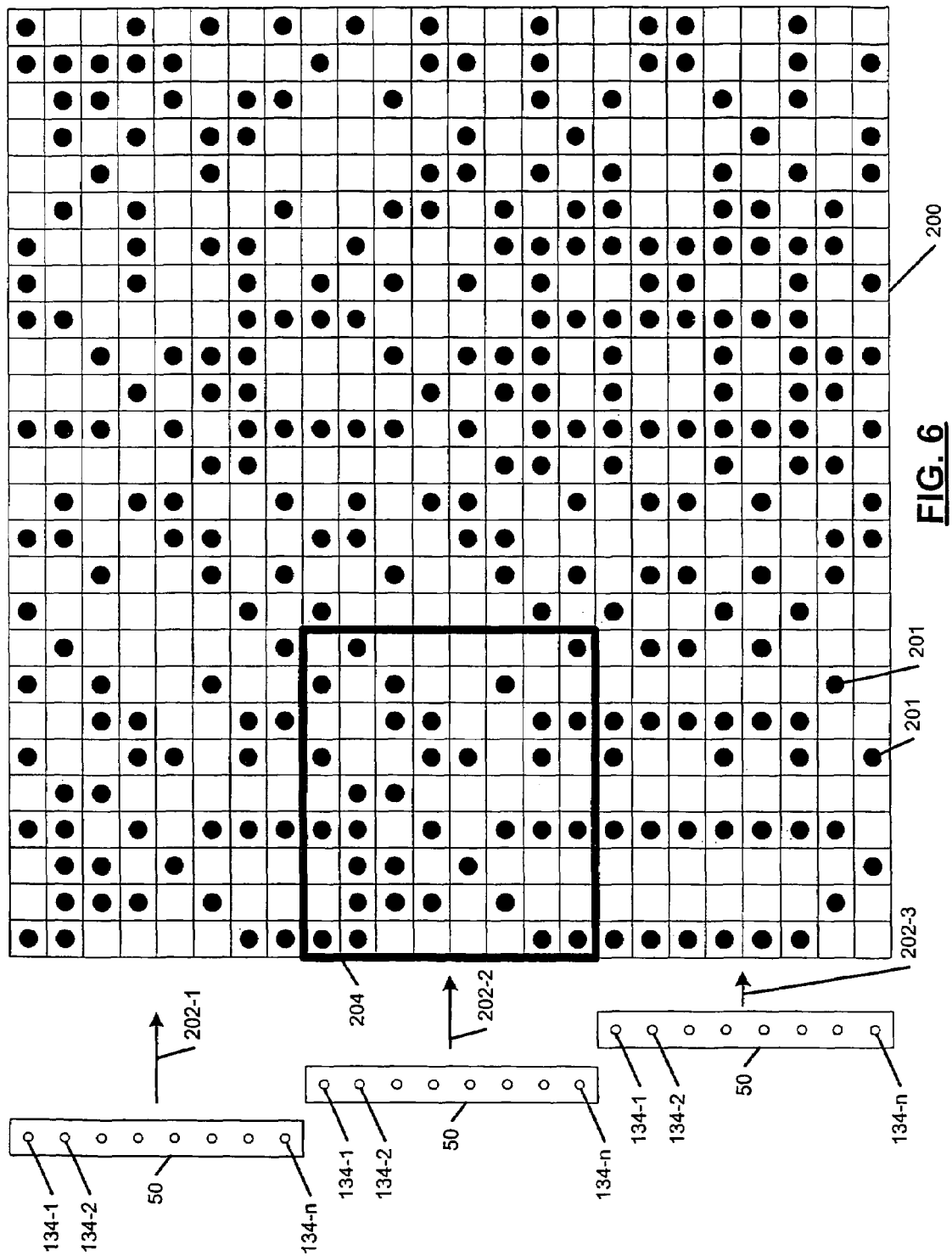
FIG. 6 illustrates an exemplary feature pattern to be microdeposited onto a substrate including sub-features that are defined by droplets of fluid material.

Referring now to FIGS. 6-8, an exemplary feature pattern 200 is shown. While the feature pattern 200 includes non-overlapping droplets forming individual sub-features 201, the droplets or sub-features 201 can be overlapping. Spacing between the individual sub-features 201 can be adjusted to be smaller or larger. In the example in FIG. 6, the feature pattern 200 is microdeposited in 3 passes identified at 202-1, 202-2 and 202-3. Each nozzle 134-1, 134-2, . . . and 134-n deposits a row of sub-features 201. The position of the microdeposition head 50 during the pass 202-1 and 202-2 is offset by the width of the microdeposition head 50 in the pass 202-2 and 202-3, respectively.

More generally, the feature pattern 200 can be microdeposited in a minimum of n passes. The number of passes n is determined by a rounded-up integer value of a length of the feature pattern (in a direction perpendicular to the direction of passes) divided by the width of the microdeposition head 50. The microdeposition head 50 is located in n different pass positions that are spaced approximately the width of the microdeposition head 50. The same nozzle is used to microdeposit all of the sub-features in the same row.

Using the mask, the number of passes will increase. The sub-features of the feature pattern 200 are microdeposited according to the present invention in (n+m) passes. The microdeposition head 50 is moved to pass positions that are spaced less than the width of the microdeposition head 50. The same nozzle is not used to microdeposit all of the sub-features 201 in the same row.

A portion 204 of the feature pattern 200 is shown in FIG. 7. Using the microdeposition head 50, the first nozzle 134-1 can microdeposit sub-features in columns 208-1, 2084, 208-6, and 208-7 in a first row 206-1 of the feature pattern 204 by firing the droplets of fluid at the appropriate time. Likewise, second, third, . . ., and nth rows 206-2, 206-3, . . . and 206-n, respectively can be microdeposited in a similar manner during the same pass.

While the pitch of the microdeposition head 50 is shown to be approximately perpendicular to a direction of movement of the microdeposition head, other pitch angles can be used as described above. Additionally, the head assembly may include multiple microdeposition heads. The relative position of the multiple heads can be adjusted using microactuators or fixed in production. As can be appreciated, the feature pattern in the direction of the pass can be any length.

During operation and/or between diagnostics, misalignment of one or more nozzles may occur and/or droplet formation may change. In addition, the tolerances of operating nozzles may be unacceptable. For example, the nozzle 134-2 may be misaligned and/or have non-ideal droplet formation. Alternately, the tolerance of nozzle 134-3 and 134-4 may cause a difference of 10% as described in the example set forth above. By using the same nozzle to form the sub-features in a specific area such as all of the sub-features 201 in a row in the pass direction, the effects of the misaligned nozzle 134-2 (or nozzle having non-ideal droplet formation) or the tolerance of functioning nozzles may cause substantial problems in the finished device. By using the mask, the localized error rate or variations are reduced, which increases yields.

The mask generator 118 according to the present invention provides a mask that assigns individual sub-features in the feature pattern to a particular pass of the microdeposition head 50 and to a particular nozzle of the microdeposition head. The mask generator 118 varies the use of the nozzles to reduce the impact of a misaligned nozzle and/or nozzles that generate non-ideal droplets. By reducing the potential for localized defects, the yield of the microdeposition process can be improved. The mask generator 118 may use a randomizing function or other suitable methods for altering the relationship between the nozzle assigned to the features of the feature pattern.

Referring now to FIGS. 9-22, an exemplary mask for the portion 204 is shown. In FIG. 9, the complete mask is shown. Multiple passes (generally identified at 210) of the microdeposition head will be required to cover the same area. The microdeposition head 50 is moved relative to the substrate (as shown generally at 214) to allow the assigned nozzle to microdeposit the droplet in accordance with the mask generated by the mask generator 118.

In a first pass shown in FIG. 10, the first nozzle 134-1 of the microdeposition head 50 is aligned with the second row 206-2. The first nozzle 134-1 microdeposits a droplet in a second column 208-2 of the second row 206-2 to form a sub-feature. A second nozzle 134-2 microdeposits a droplet in a third column 208-3 of the third row 206-3. A fourth nozzle 134-4 microdeposits a droplet in a sixth column 208-6 of a fifth row 206-5. As can be appreciated, the number of droplets microdeposited in each row can be varied.

Referring now to FIG. 11, a second pass is performed by positioning the microdeposition head 50 with the first nozzle 134-1 adjacent to the fourth row 206-4. The first, third, fourth and fifth nozzles 134-1, 134-3, 134-4 and 134-5, respectively, microdeposit droplets in the seventh, eighth, seventh, and fourth columns 208-7, 208-8, 208-7, and 208-4, respectively.

Figures 12, 13:
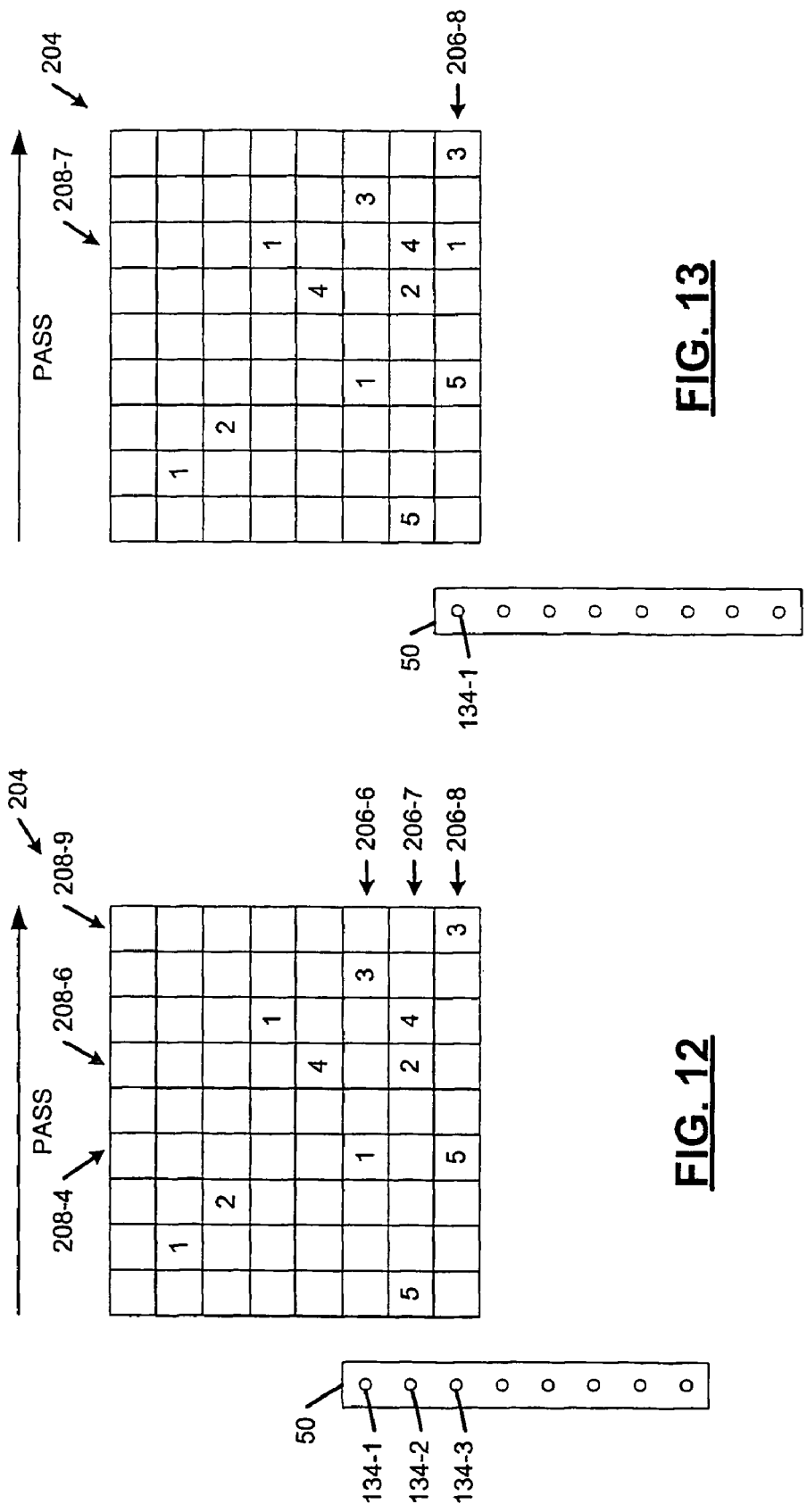

Referring now to FIG. 12, a third pass is performed by positioning the microdeposition head 50 with the first nozzle 134-1 adjacent to the sixth row 206-6. The first, second and third nozzles 134-1, 134-2, and 134-3, respectively, microdeposit droplets in the fourth, sixth and ninth columns 208-4, 208-6, 208-9, respectively.

Referring now to FIG. 13, a fourth pass is performed by positioning the microdeposition head 50 with the first nozzle 134-1 adjacent to the eighth row 206-8. The first nozzle 134-1 microdeposits a droplet in the seventh column 208-7, respectively.

Figures 14, 15:
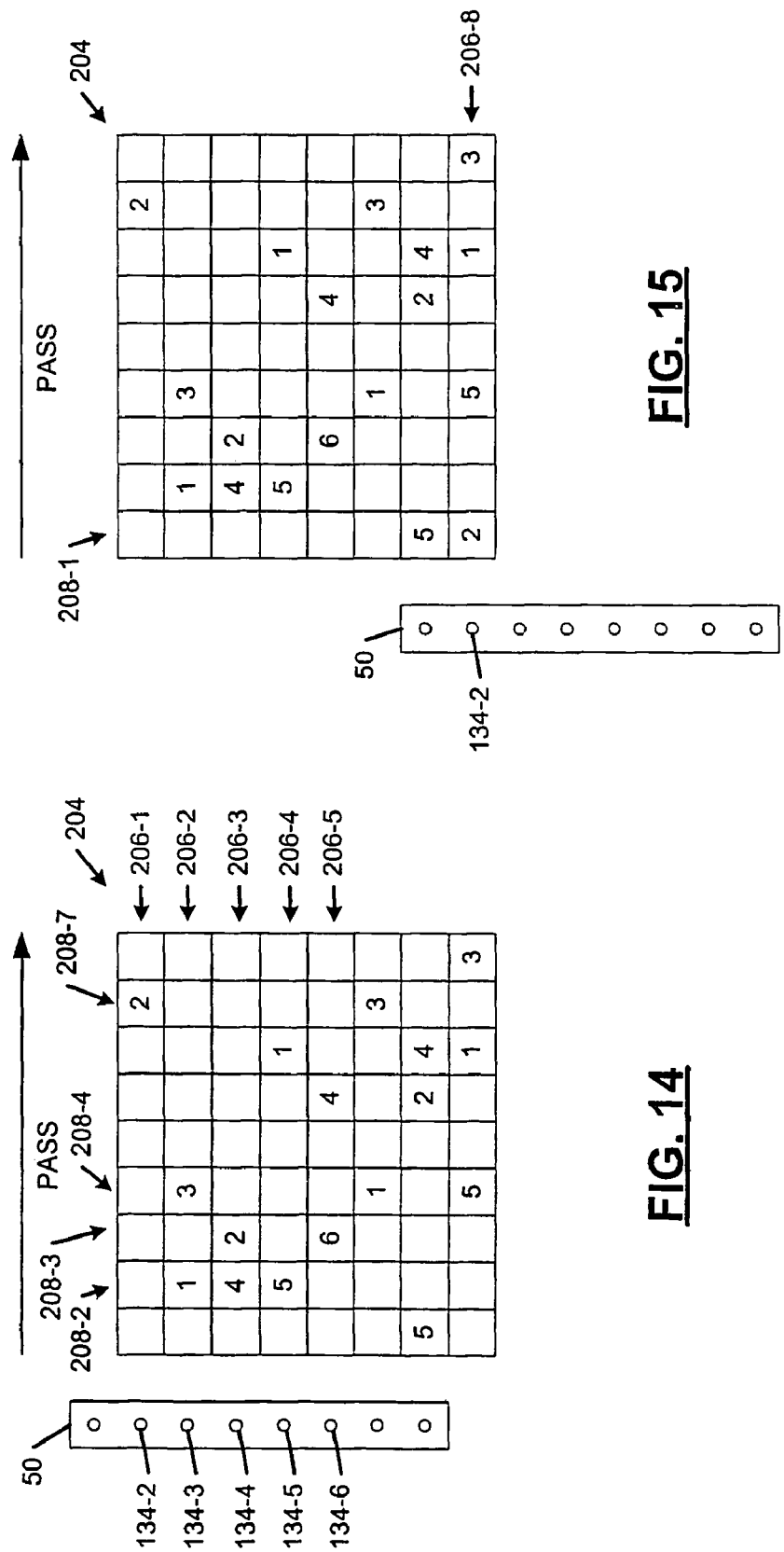

Referring now to FIG. 14, a fifth pass is performed by positioning the microdeposition head 50 with the second nozzle 134-2 adjacent to the first row 206-1. The second, third, fourth, fifth and sixth nozzles 134-2, 134-3, 1344, 134-5, and 134-6, respectively, microdeposit droplets in the seventh, fourth, second, second, and third columns 208-7, 208-4, 208-2, 208-2, and 208-3, respectively.

Referring now to FIG. 15, a sixth pass is performed by positioning the microdeposition head 50 with the second nozzle 134-2 adjacent to the eighth row 206-8. The second nozzle 134-2 microdeposits a droplet in the first column 208-1.

Referring now to FIG. 16, a seventh pass is performed by positioning the microdeposition head 50 with the third nozzle 134-3 adjacent to the first row 206-1. The third and fourth nozzles 134-3 and 134-4 microdeposit droplets in the first and fifth columns 208-1 and 208-5.

Referring now to FIG. 17, an eighth pass is performed by positioning the microdeposition head 50 with the fifth nozzle 134-5 adjacent to the first row 206-1. The fifth, sixth, seventh and eighth nozzles 134-5, 134-6, 134-7 and 134-8, respectively, microdeposit droplets in the fourth, seventh, ninth, and fourth columns 208-4, 208-9, 208-7 and 208-4, respectively.

Figures 18, 19:
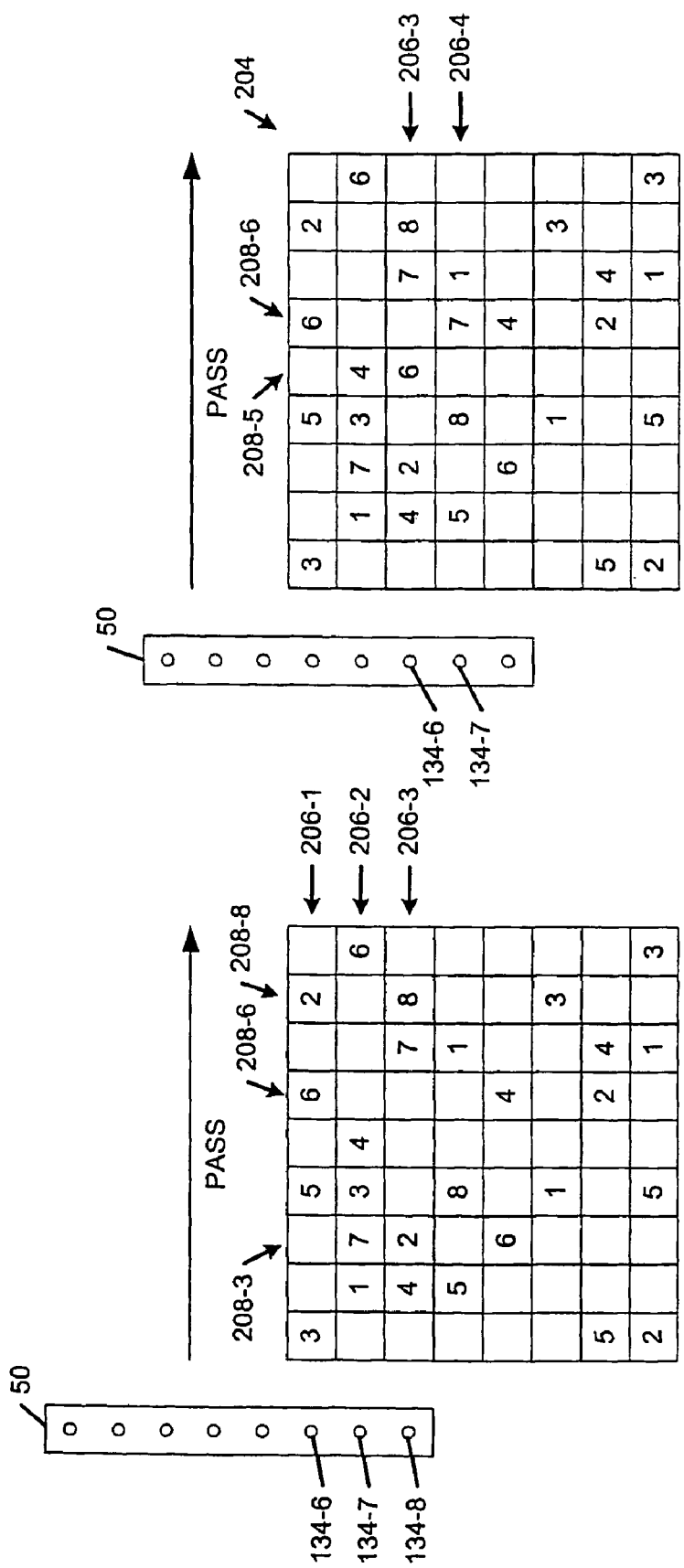

Referring now to FIG. 18, a ninth pass is performed by positioning the microdeposition head 50 with the sixth nozzle 134-6 adjacent to the first row 206-2. The sixth, seventh and eighth nozzles 134-6, 134-7, and 134-8, respectively, microdeposit droplets in the sixth, third and eighth columns 208-6, 208-3, and 208-8, respectively.

Referring now to FIG. 19, a tenth pass is performed by positioning the microdeposition head 50 with the sixth nozzle 134-6 adjacent to the third row 206-3. The sixth and seventh nozzles 134-6 and 134-7, respectively, microdeposit droplets in the fifth and sixth columns 208-5 and 208-6, respectively.

Figures 20, 21:
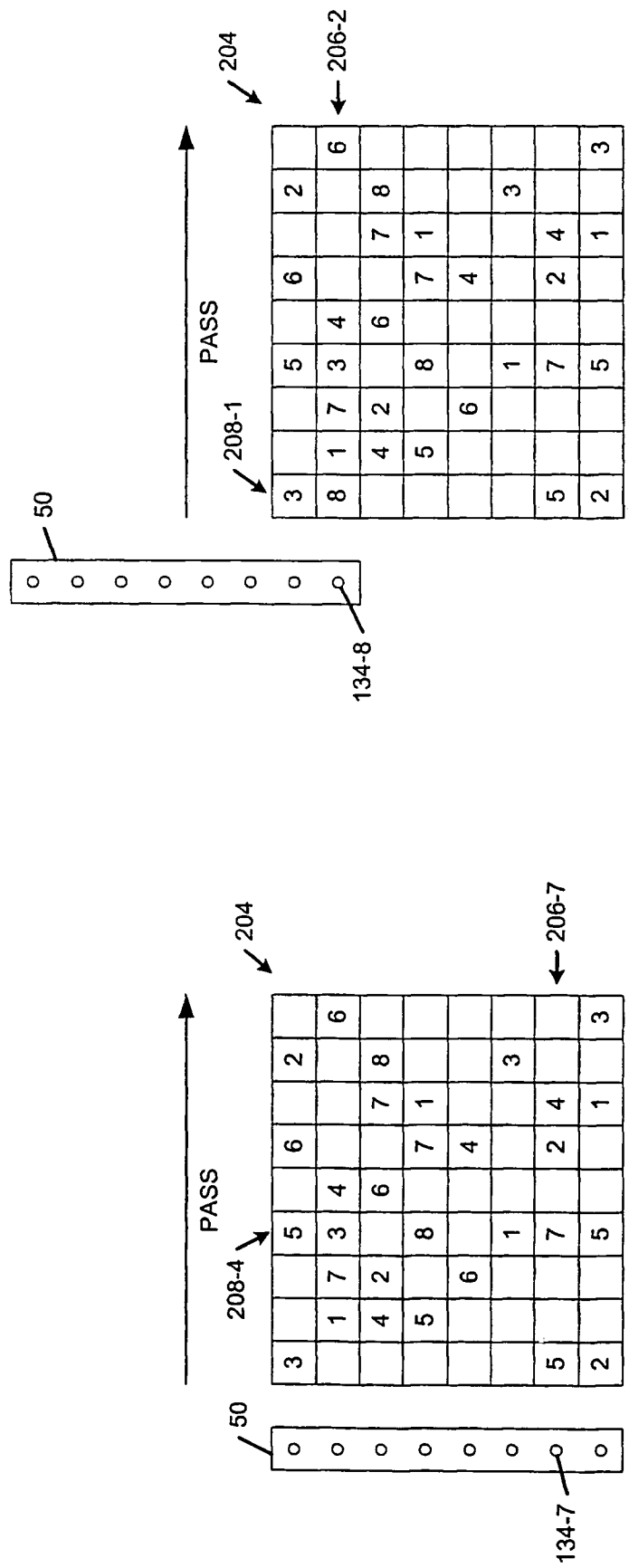

Referring now to FIG. 20, a eleventh pass is performed by positioning the microdeposition head 50 with the seventh nozzle 134-7 adjacent to the seventh row 206-7. The seventh nozzle 134-7 microdeposits a droplet in the fourth column 2084.

Referring now to FIG. 21, a twelfth pass is performed by positioning the microdeposition head 50 with the eighth nozzle 134-8 adjacent to the second row 206-2. The eighth nozzle 134-8 microdeposits a droplet in the first column 208-1.

Figure 22:
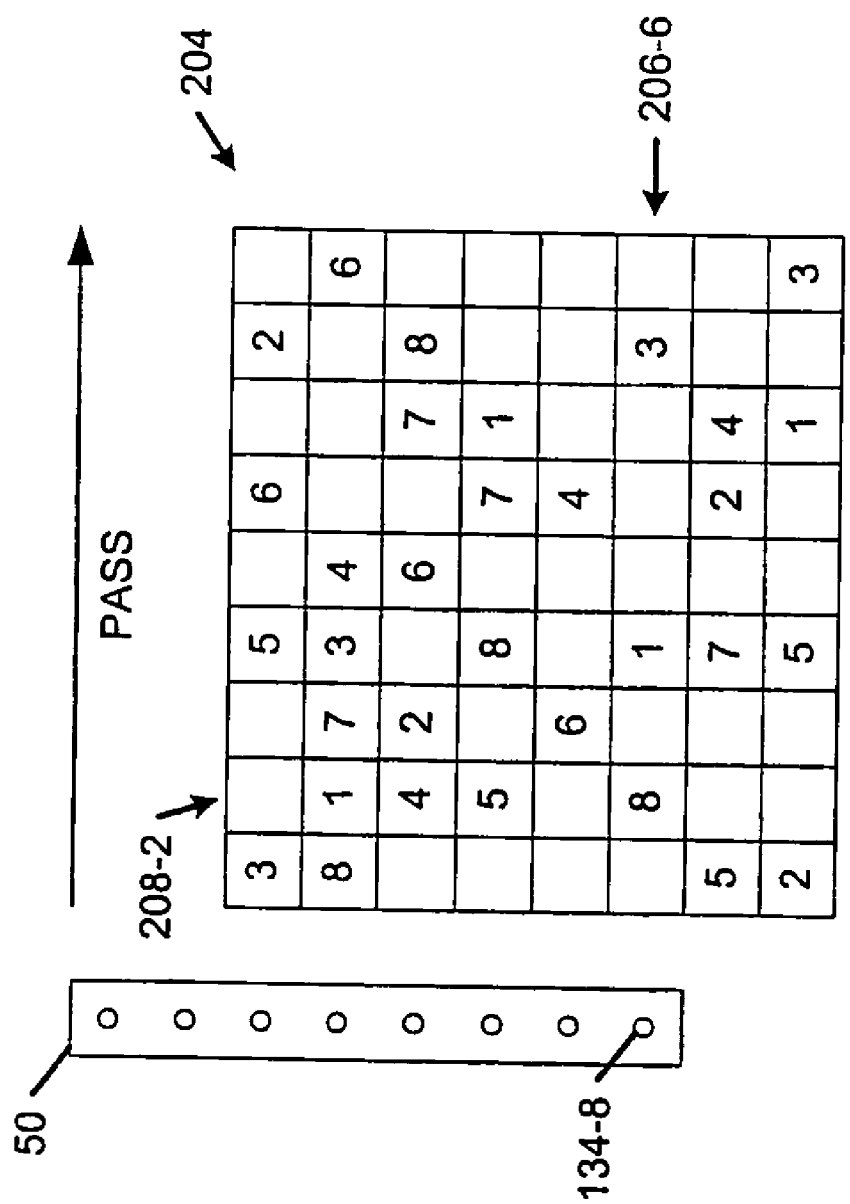

Referring now to FIG. 22, a thirteenth pass is performed by positioning the microdeposition head 50 with the eighth nozzle 134-8 adjacent to the sixth row 206-6. The eighth nozzle 134-8 microdeposits a droplet in the second column 208-2.

As can be appreciated, when nozzles 134 of the microdeposition head are not aligned with a row of the portion 204 during a pass, the non-aligned nozzles can be used to microdeposit droplets in rows above or below the portion 204. For example, referring back to FIG. 11, the nozzles 134-6, 134-7 and 134-8 can be used to microdeposit droplets in rows of the feature pattern 200 that are one, two and three rows, respectively, below the row 206-8. Likewise, additional columns before and/or after the column 208-9 can be microdeposited during the passes described in FIGS. 10-22.

Other functions can be used by the mask generator 118 to generate the mask. For example, the function need not be random. Referring now to FIG. 8, if three passes are desired, one third of the sub-features can be microdeposited with the microdeposition head 50 located as shown. The microdeposition head can be moved to a second position and a second third of the sub-features can be microdepositioned. Finally, a final third of the sub-features can be microdeposited with the microdeposition head 50 in a third position.

In other words, any function that does not involve microdepositioning all of the sub-features in a row using the same nozzle during a microdeposition pass can be used. Additional mask functions are disclosed in "System and Method for Color Image Reproduction From Color Separations Prepared from Random Fixed Size Dot Placement" U.S. Pat. No. 5,175,804 to Wittmann, Issued Dec. 29, 1992, which is hereby incorporated by reference in its entirety.

Referring now to FIG. 23, a portion of a feature pattern 230 may include several layers that are microdeposited during multiple passes. For example, a sub-feature 234 includes first, second and third droplets 238-1, 238-2 and 238-3 that are microdeposited using the same nozzle during first, second and third passes, 240-1, 240-2 and 240-3, respectively.

Referring now to FIG. 24, sub-features of each layer can be microdeposited in three passes in a manner similar to FIG. 9. However, the sub-feature 234 may have a specified thickness or other design parameter. If the nozzle that is used to define the sub-feature 234 is not depositing a uniform or predetermined droplet volume and/or shape and/or the droplet is not aligned correctly or the tolerances of adjacent functioning nozzles are unacceptable, the sub-feature may not meet the design parameter. If the defects caused by the errant nozzle or tolerances can be confined to a single droplet in one layer or pass, there is a much higher probability that the sub-feature will meet the design parameter.

Accordingly, the mask generator 118 according to the present invention uses a different nozzle for depositing subsequent layers. For example, a first layer 248-1 of the feature 234 is microdeposited by the sixth nozzle 134-6 during one pass. A second layer 248-2 is defined by the fifth nozzle 134-5 during another pass. A third layer 248-3 is defined by the third nozzle 134-3 during another pass. As can be appreciated, each of the layers 250-1, 250-2, and 250-3 can be microdeposited during one or more passes.

As can be appreciated by skilled artisans, the number of passes will be determined by design criteria and the tolerance of the nozzles. Increasing the number of passes tends to increase the microdeposition speed or the amount of time required to microdeposit the feature pattern. Increasing the number of passes also tends to increase the accuracy or quality of the feature pattern by reducing the impact of tolerance variations of functioning and/or malfunctioning nozzles.

Figure 26:
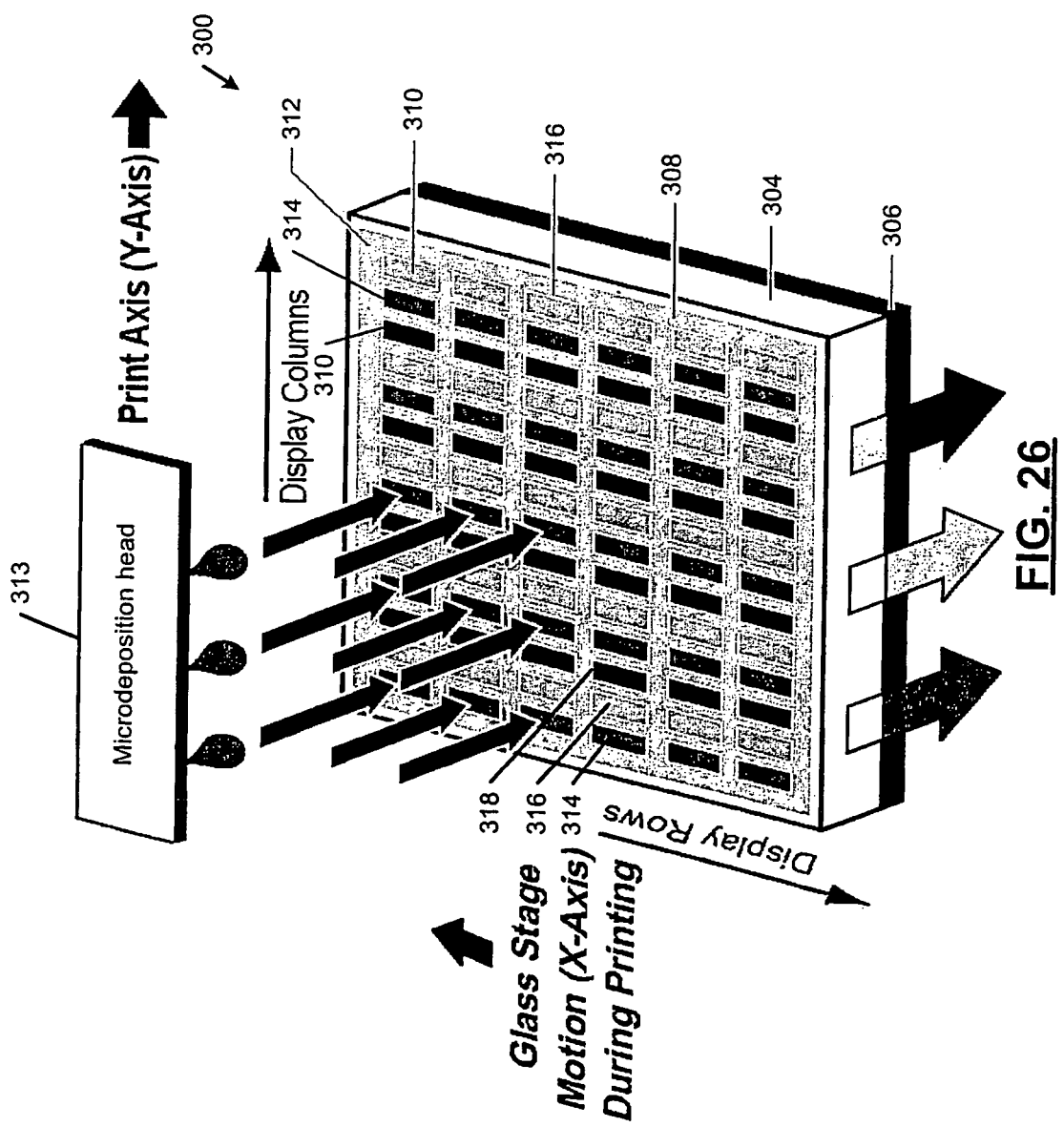
FIG. 26 illustrates an exemplary polymer light-emitting diode (PLED) display device.

Referring now to FIG. 26, an exemplary polymer light-emitting diode (PLED) display device 300. The PLED device 300 include a glass plate 304 that is held by a vacuum chuck 306 or any other suitable device during microdeposition. The PLED device 300 further includes an ITO anode 308, a hole transport layer (typically PEDOT or PANI) (not shown), a polymer emissive material 310 and resist 312. Microdeposition heads 313 are used to microdeposit a repeating pattern of red 314, green 316 and blue 318 components of PLED pixels.

Figure 27:
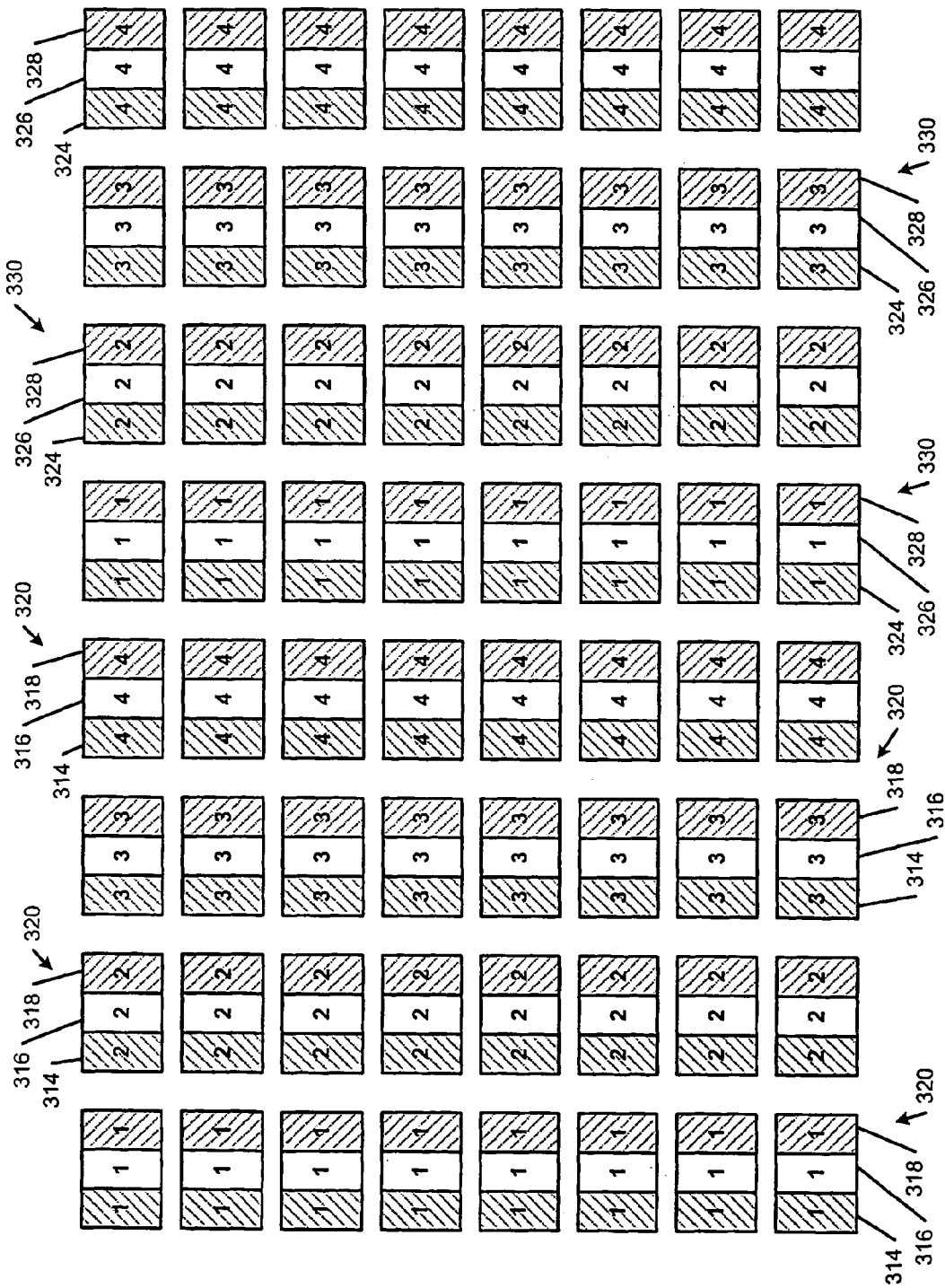
FIG. 27 illustrates microdeposition of red, green and blue components forming a pixel using a first method.

Referring now to FIG. 27, one pattern for microdepositing red 314, green 316 and blue 318 components of PLED pixels 320 is shown. The red 314, green 316 and blue 318 pixel components of each pixel are microdeposited by the red, green and blue microdeposition heads, respectively. Each of the pixel components includes multiple adjacent and/or overlapping droplets. The droplets of each pixel component are preferably microdeposited using the same nozzle to allow all of the droplets for the pixel component to be microdeposited while the droplets of the pixel component are still wet.

For example, the red microdeposition head microdeposits the red components 314 labeled "1", "2", "3" and "4" in FIG. 27 in one pass using four nozzles. The red microdeposition head is repositioned and then the red microdeposition head microdeposits the red components 324 labeled "1", "2", "3" and "4" in FIG. 27 in a second pass. The green microdeposition head microdeposits the green components 316 and 326 labeled "1", "2", "3" and "4" in first and second passes, respectively. The blue microdeposition head likewise microdeposits the blue components 316 and 326 labeled "1", "2", "3" and "4" in first and second passes, respectively.

For example, if the second nozzle on the green microdeposition head is not depositing a sufficient amount of polymer emissive material (either on low side within tolerance or outside of tolerance), the resulting PLED display may have a line defect that will be noticeable to the naked eye. The same problem may occur if adjacent nozzles are at opposite ends of (and within) the tolerance for alignment and/or droplet volume or if the nozzles are outside of the tolerances for droplet alignment or volume, as described above.

Figure 28:
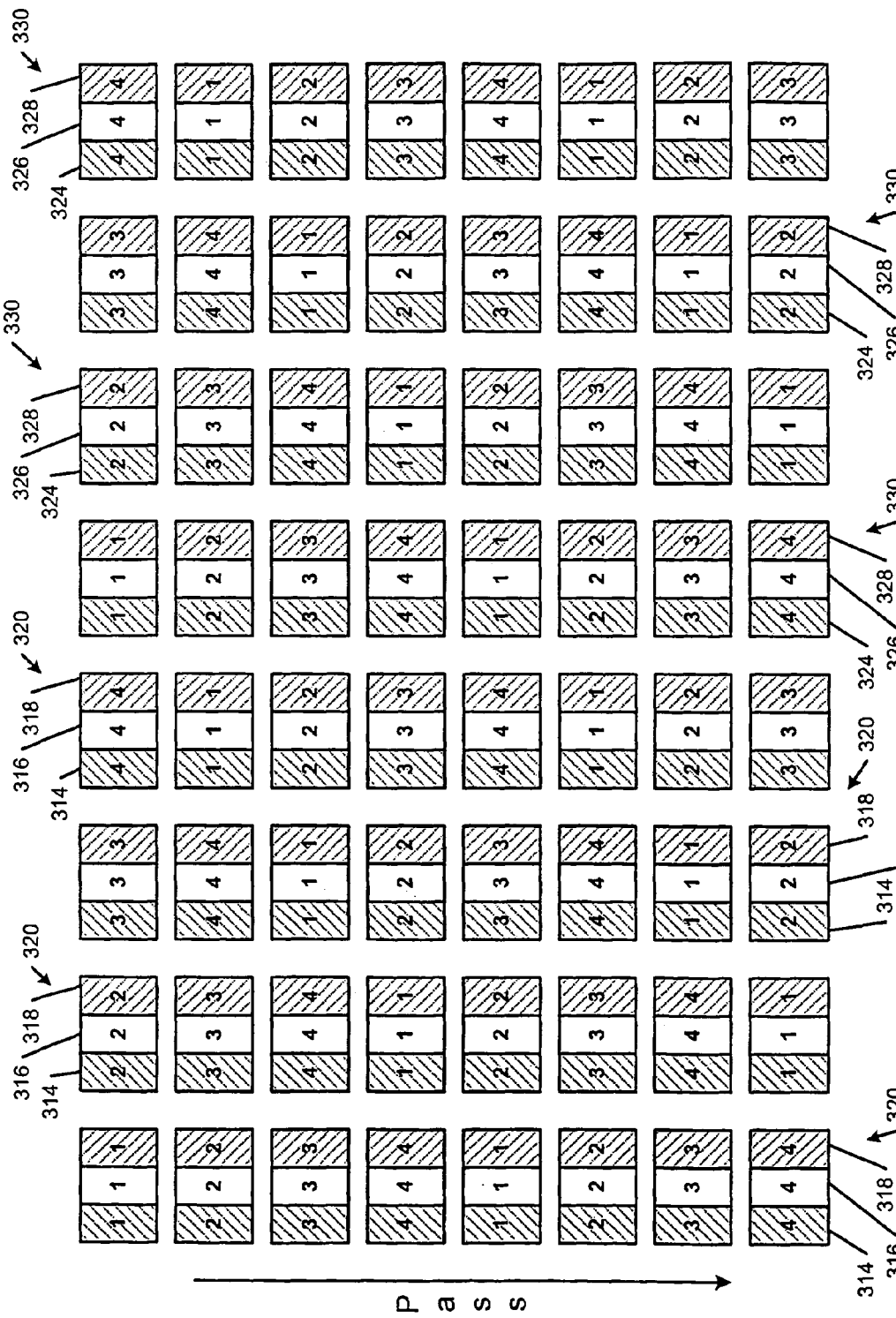
FIG. 28 illustrates microdeposition of red, green and blue pixel components forming pixels using the masking method according to the present invention.

Referring now to FIG. 28, another pattern for microdepositing red 314, green 316 and blue 318 pixel components of PLED pixels 320 is shown. The red 314, green 316 and blue 318 pixel components of each pixel are microdeposited by the red, green and blue microdeposition heads, respectively. The mask is used to vary the nozzle that is used to microdeposit pixel components of adjacent pixels having the same color polymer emissive material in the display row or column as was discussed in detail above. For example, instead of taking two passes as in FIG. 27, the PLED takes eight passes.

For example, if the second nozzle on the green microdeposition head is not depositing a sufficient amount of polymer emissive material, the resulting PLED display will not have a line defect that will be noticeable to the naked eye if the mask is used. If adjacent nozzles are at opposite ends of (and within) the tolerance for alignment and/or volume or if the nozzles are outside of the tolerances for alignment or volume, as described above, the masking process reduces the adverse impact of the nozzle.

While a simple offset-row offset pattern is shown in FIG. 28, more complex random or non-random masks that are described above can be used. In addition, while a color PLED is shown in FIGS. 26-28, monochrome PLEDs can also be microdeposited using similar techniques.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A microdeposition system for microdepositing droplets of fluid material onto a substrate, comprising:

a microdeposition head that includes a plurality of spaced nozzles;

a positioning device that controls a position of said microdeposition head relative to said substrate; and a controller including:

a receiver that receives a feature pattern;

a mask generating module that creates a mask based on said feature pattern to reduce a density of defects that occur due to at least one of tolerance variations and a malfunctioning nozzle of said microdeposition head, and that assigns sub-features of said feature pattern to selected nozzles and selected passes of said microdeposition head based on said mask;

a positioning module that communicates with said positioning device and that generates position control signals for said positioning device based on said selected passes, and a nozzle firing module that communicates with said microdeposition head and that selectively generates nozzle firing commands to fire said droplets from said selected nozzles onto said substrate during said selected passes to define said sub-features of said feature pattern.

2. The microdeposition system of claim 1 wherein said mask generating module randomizes said selected nozzles assigned to said sub-features.

3. The microdeposition system of claim 1 wherein a microdeposition pass is performed by at least one of moving said microdeposition head in a linear direction relative to said substrate and moving said substrate in a linear direction relative to said microdeposition head.

4. The microdeposition system of claim 1 wherein at least one of said sub-features is formed by multiple droplets that are microdeposited in layers, and wherein said mask assigns a different nozzle to each of said layers of said multiple-layer sub-feature.

5. The microdeposition system of claim 1 wherein said droplets form at least one of a light emitter, an electrical conductor, an electrical trace, an insulator, a solder bump, bondwire, plating, interconnects, a capacitor and a resistor.

6. The microdeposition system of claim 1 wherein said mask increases a number of microdeposition passes and reduces firing of nozzles of said microdeposition head during each of said microdeposition passes.

7. The microdeposition system of claim 1 wherein said selected nozzle and said selected pass assigned to microdeposit one of said droplets on a first location of said substrate vary based on said feature pattern.

8. The microdeposition system of claim 1 wherein said feature pattern defines a component of an electrical device.

9. The microdeposition system of claim 8 wherein said electrical device is one of a polymer light emitting diode, a light panel, an integrated circuit package and a printed circuit board.

10. A microdeposition system that microdeposits droplets of fluid material to define pixels of a polymer light emitting display (PLED) on a substrate, comprising:
 a microdeposition head that includes a plurality of spaced nozzles;
 a positioning device that controls a position of said microdeposition head relative to said substrate; and
 a controller including:
  a receiver that receives information indicating locations of said pixels of said PLED on said substrate;
  a mask generating module that creates a mask based on said information that reduces a density of defects that occur due to at least one of tolerance variations and a malfunctioning nozzle of said microdeposition head, and that assigns sub-features of said pixels to selected nozzles and selected passes of said microdeposition head based on said mask,
  a positioning module that communicates with said positioning device and that generates position control signals for said positioning device based on said mask, and
  a nozzle firing module that communicates with said microdeposition head and that selectively generates nozzle firing commands to fire said droplets from said selected nozzles onto said substrate during said selected passes to define said pixels.

11. The microdeposition system of claim 10 wherein a microdeposition pass is performed by at least one of moving said microdeposition head in a linear direction relative to said substrate and moving said substrate in a linear direction relative to said microdeposition head.

12. The microdeposition system of claim 10 wherein said PLED is a color PLED and wherein said pixels include first, second and third pixel components having different colors.

13. The microdeposition system of claim 10 wherein said PLED is a monochrome PLED.

14. The microdeposition system of claim 10 wherein said selected nozzle and said selected pass assigned to microdeposit one of said droplets on a first location of said substrate vary based on said information.

15. The microdeposition system of claim 10 wherein said pixels include pixel components and wherein each of said pixel components is formed by multiple droplets.

16. The microdeposition system of claim 15 wherein said mask generating module randomizes said selected nozzles for said pixel components of said pixels.

* * * * *

UNITED STATES PATENT AND TRADEMARK OFFICE
CERTIFICATE OF CORRECTION

PATENT NO. : 7,611,754 B2 Page 1 of 1
APPLICATION NO. : 10/535997
DATED : November 3, 2009
INVENTOR(S) : Edwards et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 951 days.

Signed and Sealed this

Twelfth Day of October, 2010

David J. Kappos
*Director of the United States Patent and Trademark Office*